(12) United States Patent
Gieski et al.

(10) Patent No.: US 11,158,970 B2
(45) Date of Patent: Oct. 26, 2021

(54) ELECTRICAL CONNECTOR INCLUDING HEAT DISSIPATION HOLES

(71) Applicant: FCI USA LLC, Etters, PA (US)

(72) Inventors: Christopher S. Gieski, Gardners, PA (US); Michael Blanchfield, Etters, PA (US); Michael Percherke, Etters, PA (US)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 17/003,480

(22) Filed: Aug. 26, 2020

(65) Prior Publication Data
US 2020/0395696 A1    Dec. 17, 2020

Related U.S. Application Data

(63) Continuation of application No. 15/773,882, filed as application No. PCT/US2016/060636 on Nov. 4, 2016, now Pat. No. 10,763,605.
(Continued)

(51) Int. Cl.
*H01R 12/72* (2011.01)
*H01R 12/58* (2011.01)
(Continued)

(52) U.S. Cl.
CPC ......... *H01R 12/724* (2013.01); *H01R 12/585* (2013.01); *H01R 43/205* (2013.01);
(Continued)

(58) Field of Classification Search
CPC ........... H05K 7/20136; H05K 7/20145; H05K 7/20127; H05K 7/20439; H05K 1/0203;
(Continued)

(56) References Cited

U.S. PATENT DOCUMENTS 6,058,009 A * 5/2000 Hood, III ................ G06F 1/203
361/679.47
6,313,413 B1  11/2001 Chen et al.
(Continued)

FOREIGN PATENT DOCUMENTS

CN  202259774 U   5/2012
EP  1463387 B1   10/2005
(Continued)

OTHER PUBLICATIONS

Chinese office action for Application No. 201680077424.5 dated Jul. 1, 2019.
(Continued)

*Primary Examiner* — Abdullah A Riyami
*Assistant Examiner* — Marcus E Harcum
(74) *Attorney, Agent, or Firm* — Wolf, Greenfield & Sacks, P.C.

(57) ABSTRACT

In accordance with one embodiment, an electrical connector has heat dissipation holes, and is configured to be mounted to a substrate having electrical traces that are partially offset from each other, and partially aligned with each other. The holes pass through a shroud of the electrical connector such that, when the electrical connector is mated with a second electrical connector, air flows outside a perimeter of the second electrical connector, and may cool the mated connectors as well as dissipate heat from the substrate.

20 Claims, 5 Drawing Sheets

Related U.S. Application Data

(60) Provisional application No. 62/251,720, filed on Nov. 6, 2015.

(51) Int. Cl.
*H01R 43/20* (2006.01)
*H05K 1/11* (2006.01)
*H05K 1/18* (2006.01)

(52) U.S. Cl.
CPC ............. *H05K 1/115* (2013.01); *H05K 1/184* (2013.01); *H05K 2201/09227* (2013.01); *H05K 2201/10189* (2013.01)

(58) Field of Classification Search
CPC ................... H05K 1/184; H05K 1/115; H05K 2201/09277; H05K 2201/10189; H01R 43/205; H01R 12/585; H01R 12/724; H01R 12/7088; H01R 12/716; H01R 13/5227
USPC ........................... 439/206, 485; 174/262, 260
See application file for complete search history.

(56) References Cited

U.S. PATENT DOCUMENTS

| | | | | |
|---|---|---|---|---|
| 6,563,703 B2* | 5/2003 | Xie | ............................ | G06F 1/20 174/15.2 |
| 7,131,862 B2 | 11/2006 | Vermeersch | | |
| 7,223,915 B2 | 5/2007 | Hackman | | |
| 7,258,562 B2* | 8/2007 | Daily | ................... | H01R 13/113 439/290 |
| 7,402,064 B2 | 7/2008 | Daily et al. | | |
| 7,690,937 B2 | 4/2010 | Daily et al. | | |
| 7,775,822 B2* | 8/2010 | Ngo | ................... | H01R 12/7088 439/290 |
| 7,862,359 B2 | 1/2011 | Daily et al. | | |
| 7,887,339 B2 | 2/2011 | Kumamoto et al. | | |
| 7,903,408 B1* | 3/2011 | Yu | ...................... | H05K 7/20136 361/695 |
| 8,038,466 B1* | 10/2011 | Tai | ..................... | H01R 12/7082 439/485 |
| 8,043,097 B2* | 10/2011 | Ngo | ................... | H01R 12/7088 439/79 |
| 8,062,046 B2 | 11/2011 | Daily et al. | | |
| 8,303,331 B2* | 11/2012 | Yu | ...................... | H01R 12/7088 439/485 |
| 8,393,917 B2* | 3/2013 | Regnier | ............. | H05K 7/20209 439/485 |
| 8,715,004 B2 | 5/2014 | Crighton | | |
| 9,136,645 B1* | 9/2015 | Yu | ...................... | H01R 13/4223 |
| 10,181,674 B1* | 1/2019 | Sykes | ................ | H01R 12/7088 |
| 10,763,605 B2 | 9/2020 | Gieski et al. | | |
| 2004/0104465 A1 | 6/2004 | Kusakabe et al. | | |
| 2004/0188138 A1 | 9/2004 | Baras et al. | | |
| 2006/0121789 A1 | 6/2006 | Hashim | | |
| 2008/0160837 A1 | 7/2008 | Siemon et al. | | |
| 2008/0207029 A1* | 8/2008 | Defibaugh | ............. | H01R 13/46 439/206 |
| 2008/0268671 A1 | 10/2008 | Harris | | |
| 2010/0048056 A1* | 2/2010 | Daily | ................... | H01R 13/514 439/485 |
| 2012/0030146 A1 | 2/2012 | Crighton | | |
| 2012/0088379 A1* | 4/2012 | Herring | .................. | H01R 12/57 439/83 |
| 2013/0065414 A1* | 3/2013 | Yu | ........................ | H01R 12/716 439/206 |
| 2013/0109224 A1* | 5/2013 | Chin | .................. | H01R 12/7088 439/485 |
| 2014/0206230 A1 | 7/2014 | Rost et al. | | |
| 2014/0206241 A1* | 7/2014 | Chen | .................. | H01R 12/7088 439/676 |
| 2014/0302706 A1* | 10/2014 | YuQiang | ................. | H01R 13/64 439/378 |
| 2015/0173178 A1 | 6/2015 | Morzos | | |
| 2016/0198572 A1 | 7/2016 | Ishida et al. | | |
| 2017/0049004 A1* | 2/2017 | Tsai | .................... | H05K 5/026 |
| 2018/0014430 A1* | 1/2018 | Lin | .................... | H05K 7/20145 |
| 2018/0331445 A1 | 11/2018 | Gieski et al. | | |

FOREIGN PATENT DOCUMENTS

| | | |
|---|---|---|
| JP | 2011-040224 A | 2/2011 |
| TW | M485540 U | 9/2014 |

OTHER PUBLICATIONS

International Preliminary Report on Patentability for International Application No. PCT/US2016/060636 dated May 17, 2018.
International Search Report and Written Opinion for International Application No. PCT/US2016/060636 dated Feb. 24, 2017.

* cited by examiner

ELECTRICAL CONNECTOR INCLUDING HEAT DISSIPATION HOLES

RELATED APPLICATIONS

This patent application is a continuation of U.S. patent application Ser. No. 15/773,882, filed May 4, 2018, entitled "ELECTRICAL CONNECTOR INCLUDING HEAT DISSIPATION HOLES," which is a National Stage Entry of international PCT application No. PCT/US2016/060636, filed Nov. 4, 2016, entitled "ELECTRICAL CONNECTOR INCLUDING HEAT DISSIPATION HOLES," which claims priority to and the benefit of U.S. Provisional Application Ser. No. 62/251,720, filed Nov. 6, 2015, entitled "ELECTRICAL CONNECTOR INCLUDING HEAT DISSIPATION HOLES." The entire contents of these applications are incorporated herein by reference in their entirety.

BACKGROUND

Electrical power connectors include a connector housing and a plurality of electrical conductors that are supported by the housing and are configured to receive electrical power from a first electrical component, and deliver the electrical power to a second electrical component. When designing electrical power connectors, it is often desirable to increase the current carrying capacity of the electrical connector. One known method of increasing the current carrying capacity of the electrical connector is to add additional electrical conductors. However, space is often limited within a chassis. Accordingly, it is desirable to increase the current carrying capacity of the electrical conductors, thereby increasing the current carrying capacity of the electrical connector without having to increase the size of the electrical connector. It is appreciated, however, that increasing levels of current produce additional heat. What is therefore desired is an electrical connector that carries high levels of electrical current while allowing for adequate heat dissipation.

SUMMARY

In accordance with one embodiment, an electrical connector can include a housing body defining a first outer perimeter, and a plurality of electrical conductors supported by the housing body. The electrical conductors can define respective mounting ends that extend through a mounting interface of the housing body and are configured to mount to a substrate, and mating ends that are configured to mate with respective ones of a plurality of complementary electrical conductors of a second electrical connector in a mating direction. The housing body can include a shroud having a first surface and a second surface opposite the first surface, and a second outer perimeter that is disposed outboard with respect to the first perimeter along a direction perpendicular to the mating direction, such that at least a portion of each of the mating ends is surrounded by the second outer perimeter. The electrical connector can define at least one heat dissipation hole that extends through the shroud and has a first end that is open at the first surface, and a second end that is open at the second surface and is offset with respect to the first end in the mating direction. At least a portion of the first open end can be disposed at a location outboard of the first perimeter and inboard of the second perimeter.

BRIEF DESCRIPTION OF THE DRAWINGS

The foregoing summary, as well as the following detailed description of a preferred embodiment of the application, will be better understood when read in conjunction with the appended drawings. For the purposes of illustration, there is shown in the drawings various embodiments. It should be understood, however, that the application is not limited to the precise arrangements and instrumentalities shown. In the drawings.

DETAILED DESCRIPTION

Figure 1:
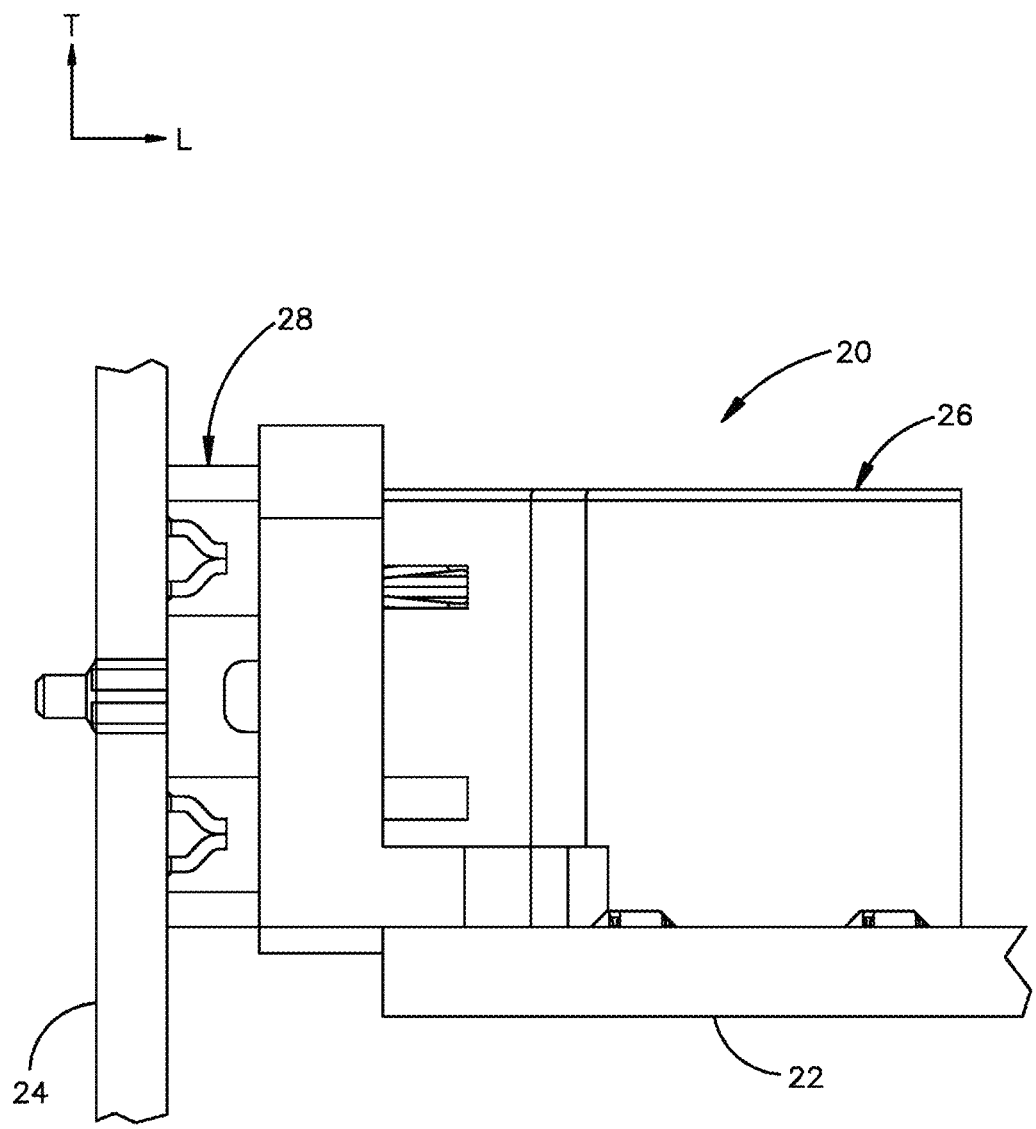
FIG. 1 is a schematic side elevation view of an electrical connector assembly in one example of the present disclosure, including first and second electrical connectors mated to each other and mounted to respective first and second substrates.

Referring to FIG. 1, an electrical connector assembly 20 includes a first substrate 22, a second substrate 24, a first electrical connector 26, and a second electrical connector 28. The first electrical connector 26 is configured to be mounted to the first substrate 22. The second electrical connector 28 is configured to be mounted to the second substrate 24. The first and second electrical connectors 26 and 28 are configured to mate with each other so as to establish an electrical connection between the first and second substrates 22 and 24. The first substrate 22 can be configured as a printed circuit board. Similarly, the second substrate 24 can be configured as a printed circuit board. The first electrical connector can be configured as an orthogonal electrical connector.

Figure 2A:
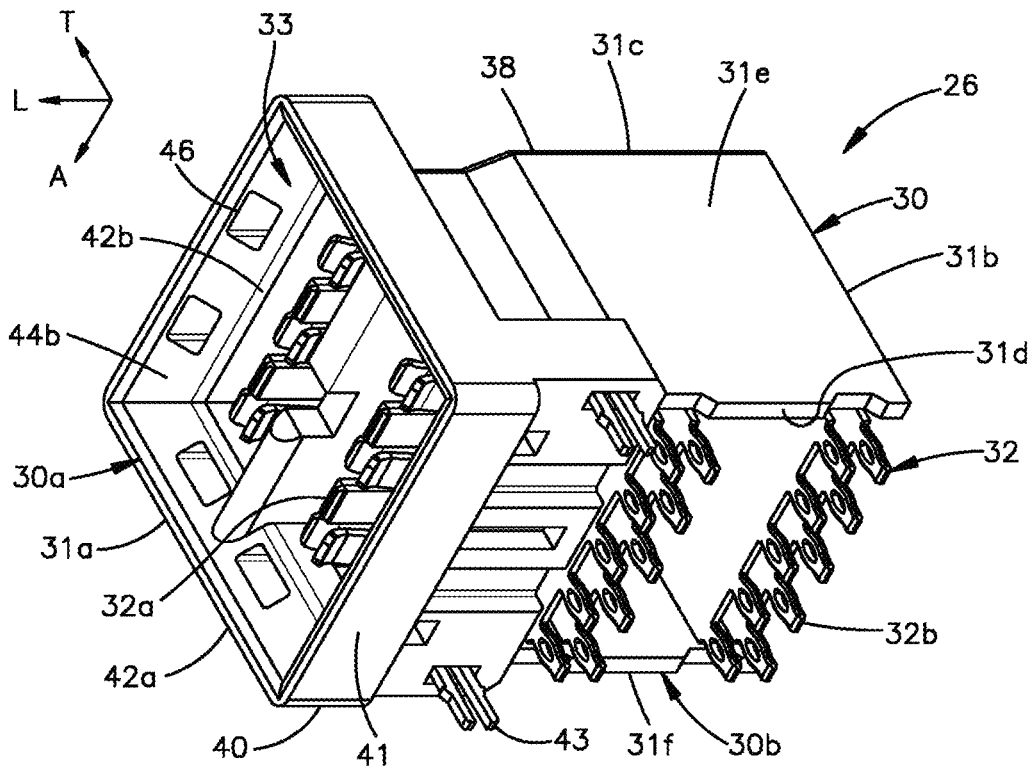
FIG. 2A is a perspective view of the first electrical connector of the electrical connector assembly illustrated in FIG. 1 in accordance with one example of the present disclosure.
Figure 2B:
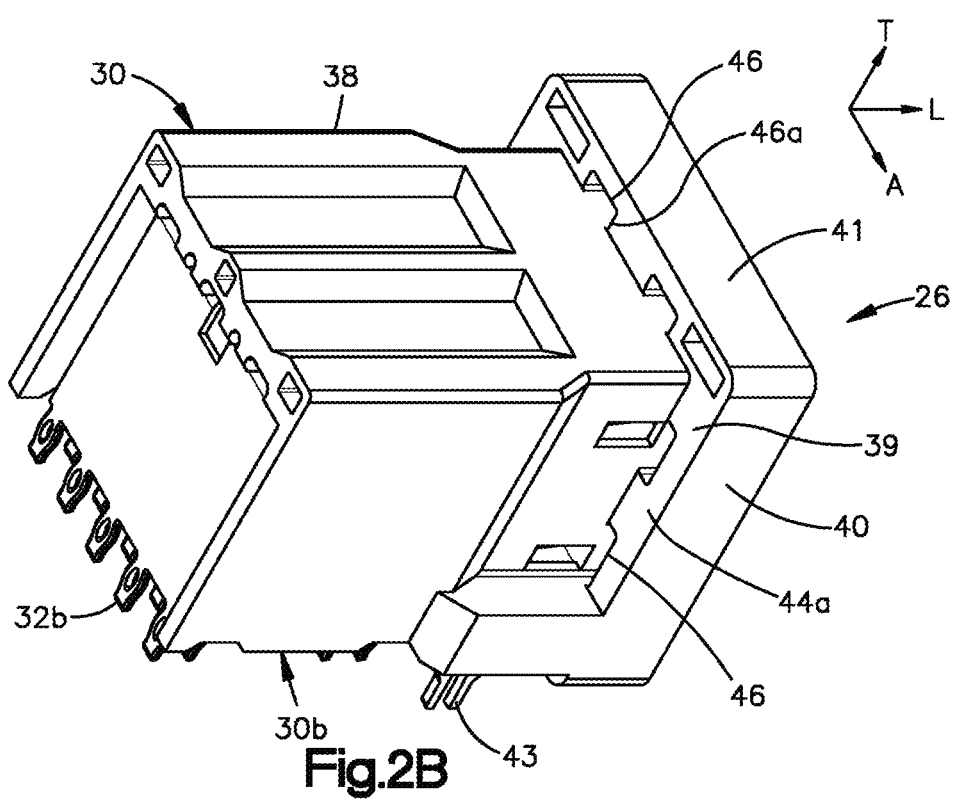
FIG. 2B is another perspective view of the electrical connector illustrated in FIG. 2A.
Figure 2C:
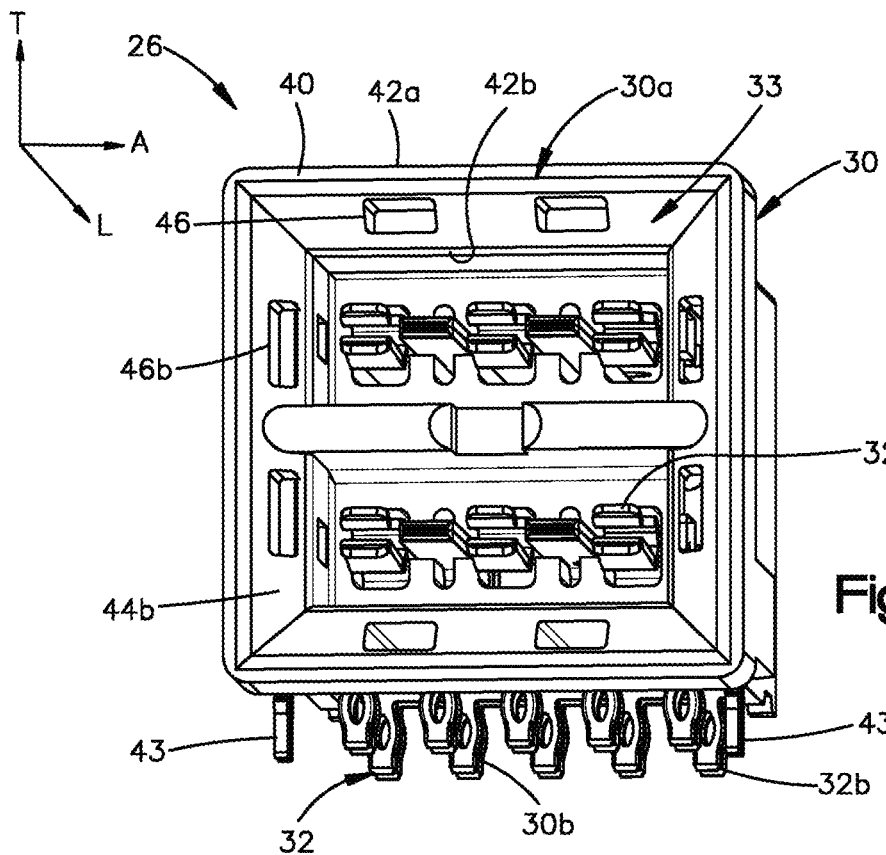
FIG. 2C is another perspective view of the electrical connector illustrated in FIG. 2A.
Figure 2D:
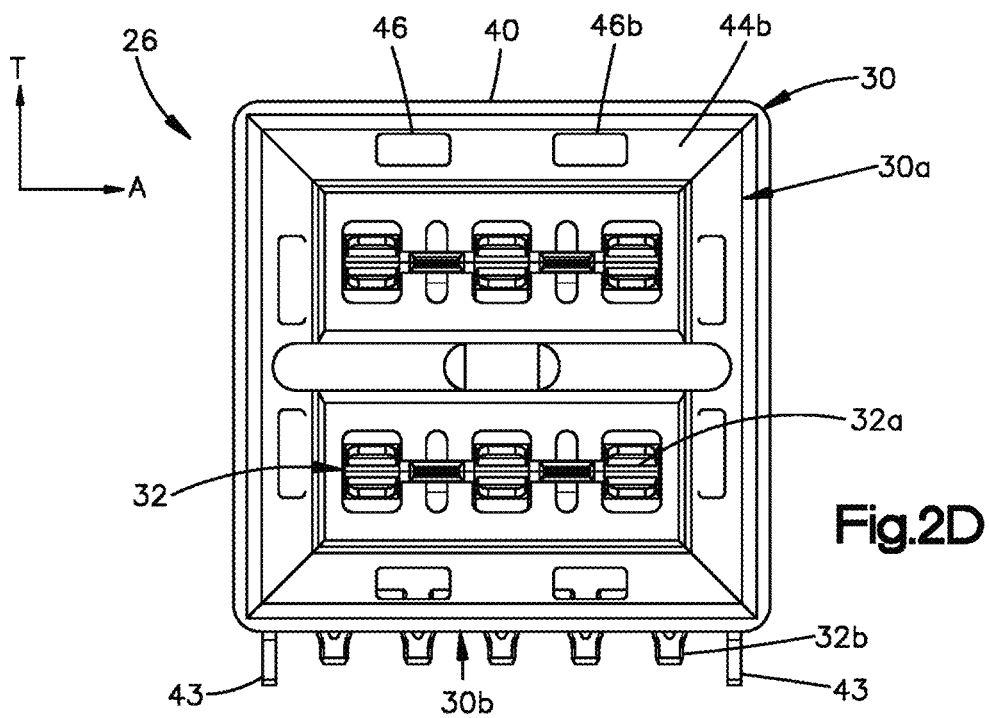
FIG. 2D is a front elevation view of the electrical connector illustrated in FIG. 2A.
Figure 3:
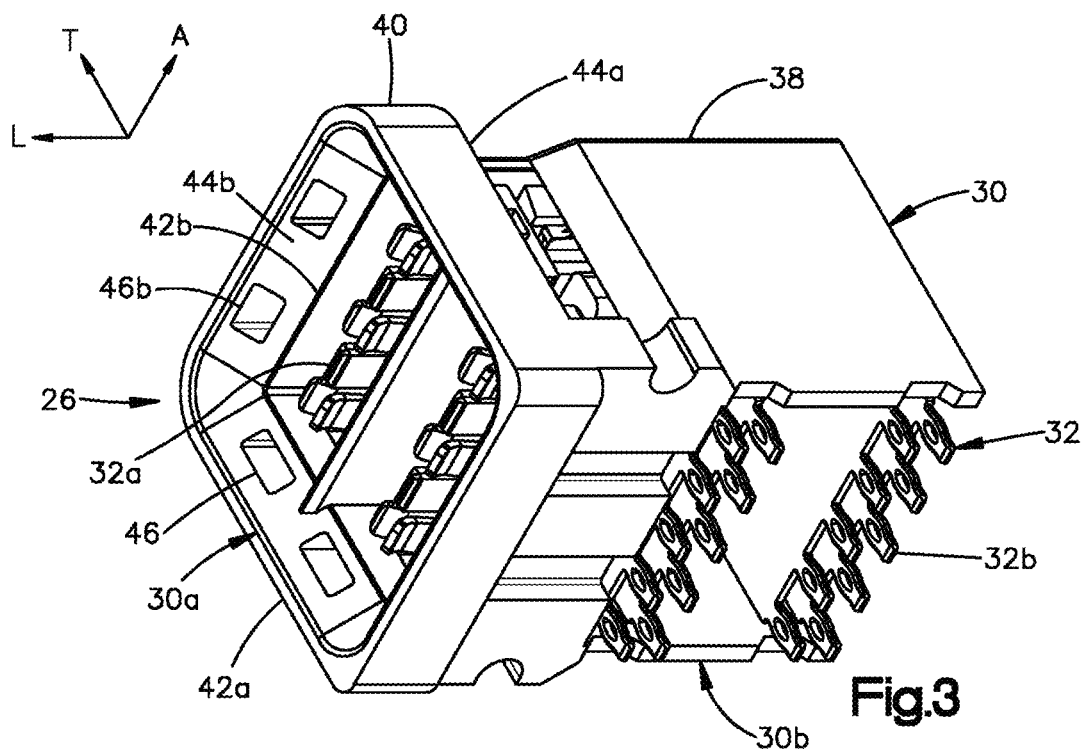
FIG. 3 is a perspective view of the first electrical connector of the electrical connector assembly illustrated in FIG. 1 in accordance with another example of the present disclosure.

Referring to FIGS. 2A-3, the first electrical connector 26 includes a first dielectric or electrically insulative connector housing 30 and a first plurality of electrical conductors 32 that are supported by the connector housing 30. The electrical conductors 32 define first mating ends 32a and first mounting ends 32b opposite the first mating ends 32a. The electrical contacts 32 can be spaced from each other along a pitch from center-to-center. The pitch can be between 8 mm and 15 mm, for instance between 8 mm and 12 mm, such as approximately 10 mm.

Figure 4:
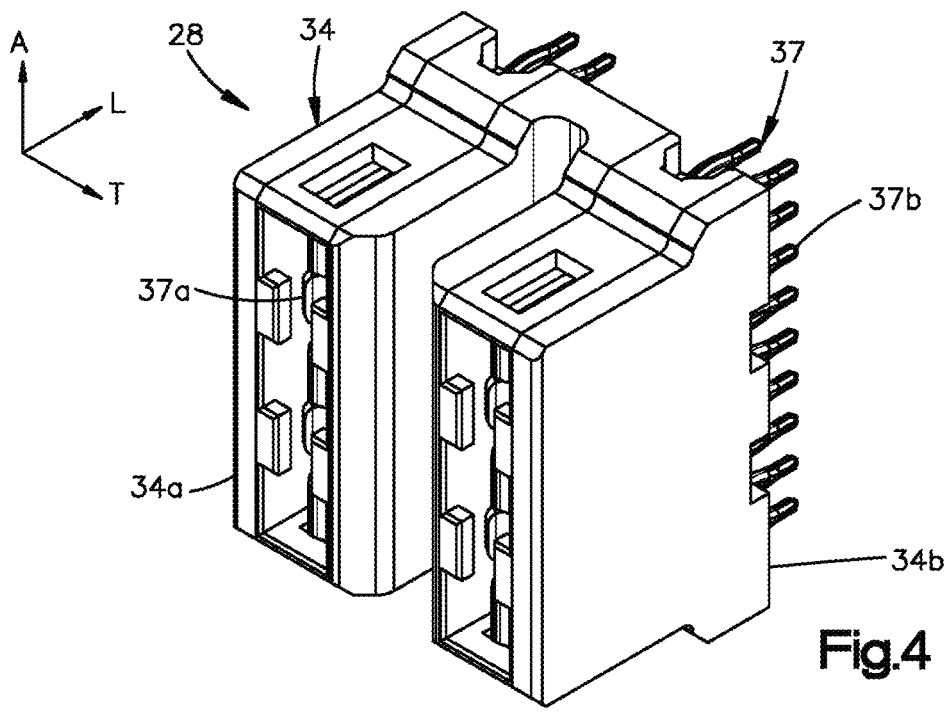
FIG. 4 is perspective view of the second electrical connector of the electrical connector assembly illustrated in FIG. 1 in accordance with one example of the present disclosure.

As illustrated in FIG. 4, the second electrical connector 28 includes a second dielectric or electrically insulative connector housing 34 and a second plurality of electrical conductors 37 that are supported by the connector housing 34. The electrical conductors 37 define second mating ends 37a and second mounting ends 37b opposite the mating ends. The first and second electrical connectors 26 and 28 are configured to mate with each other so as to place the first mating ends 32a in electrical and physical contact with the respective ones of the second mating ends 37a. In particular, the first mating ends 32a are configured to mate with respective ones of the second mating ends 37a. The first mating ends 32a can be arranged along respective columns that are spaced from each other along a row direction. The columns and the row direction can each be perpendicular to the longitudinal direction L. For instance, the row direction can be defined by the first or transverse direction T. The columns can be oriented along the third or lateral direction A. Respective pairs of the first mating ends 32a along the respective columns can define alternating blades and receptacles along the respective columns. Respective pairs of the second mating ends 37a along the respective columns can define alternating receptacles and blades along respective columns. Accordingly, the blades defined by the first mating ends 32a can be received by the receptacles of the second mating ends 37a, and the receptacles of the first mating ends can receive the blades of the second mating ends 37a.

The first plurality of electrical conductors 32 can be configured as electrical power conductors. Thus, the first plurality of electrical conductors 32 are configured to deliver electrical current between the first substrate 22 and the second electrical connector 28. Accordingly, the first electrical connector 26 can be referred to as an electrical power connector. Similarly, the second plurality of electrical conductors 37 can be configured as electrical power conductors. Thus, the second plurality of electrical conductors 37 are configured to deliver electrical current between the second substrate 24 and the first electrical connector 26. Accordingly, the second electrical connector 28 can be referred to as an electrical power connector. When the first and second electrical connectors 26 and 28 are mated to each other and mounted to the first and second substrate 22 and 24, respectively, electrical power is configured to travel between the first and second substrates 22 and 24 through the first and second electrical connectors 26 and 28.

Referring again to FIGS. 2A-3, the connector housing 30 defines a mating interface 30a and a mounting interface 30b. The first mounting ends 32b can extend out from the mounting interface 30b, and are configured to be mounted to the first substrate 22. For instance, the first mounting ends 32b can be configured to be press-fit into respective through holes of the first substrate 22 so as to mount the electrical connector 26 to the first substrate 22. For instance, the first mounting ends 32b can be configured as press-fit tails. Alternatively, the first mounting ends 32b can be configured to be surface mounted to the first substrate 22 so as to mount the first electrical connector 26 to the first substrate 22. For instance, the mounting ends 32b can be configured as surface mount tail or fusible elements such as solder balls. The first substrate 22 can be configured as a printed circuit board. For instance, the first substrate 22 can be configured as a backplane, though it should be appreciated that the first substrate can be alternatively configured as desired. For instance, the first substrate 22 can be configured as a daughtercard.

The first mating ends 32a can be disposed proximate to the mating interface 30a. The first electrical connector 26 can be configured as a right-angle connector. Thus, the first plurality of electrical conductors 32 can be configured as right-angle conductors, whereby the mating ends 32a and the mounting ends 32b are oriented substantially (within manufacturing tolerances) perpendicular to each other along a longitudinal direction L. For instance, the mating ends 32a can be oriented along a longitudinal direction L, and the mounting ends 32b can oriented along a first or transverse direction T that is substantially perpendicular to the longitudinal direction L. Similarly, the mating interface 30a can be oriented substantially perpendicular with respect to the mounting interface 30b. For instance, the mating interface 30a can be oriented along a plane that is normal to the longitudinal direction. Thus, the plane can be defined by the transverse direction T and a second or lateral direction A that is perpendicular to each of the longitudinal direction L and the transverse direction T. The mounting interface 30b can be oriented along a plane that is defined by the longitudinal direction L and the lateral direction A. Movement of the first electrical connector 26 relative the second electrical connector 28 in a mating direction, that is along the longitudinal direction L, can cause the first and second electrical connectors 26 and 28 to mate with each other. Movement of the first electrical connector 26 relative the second electrical connector 28 in an unmating direction opposite the mating direction, and thus along the longitudinal direction L, can cause the first and second electrical connectors 26 and 28 to unmate from each other.

Alternatively, the first electrical connector 26 can be configured as a vertical electrical connector whereby the mating ends 32a are oriented parallel with the mounting ends 32b. For instance, the mating ends 32a and the mounting ends 32b can be oriented along the longitudinal direction L. In one example, the mating ends 32a can be inline with respective ones of the mounting ends 32b. Similarly, the mating interface 30a and the mounting interface 30b can be opposite each other and aligned with each other along the longitudinal direction L. Further, the mating interface 30a and the mounting interface 30b can be oriented substantially (within manufacturing tolerances) parallel to each other. For instance, the mating interface 30a and the mounting interface 30b can each be oriented along respective planes that are each defined by the lateral direction A and the transverse direction T.

The connector housing 30 defines a front end 31a and a rear end 31b opposite the front end 31a along the longitudinal direction L. The connector housing 30 further defines an upper end 31c and a lower end 31d opposite the upper end 31c along the transverse direction T. The connector housing further defines a first side 30e and a second side 30f opposite the fifth end 30e along the lateral direction A. When the first electrical connector 26 is configured as a right-angle connector, the mating interface 30a is defined by the front end 31a, and the mounting interface 30b is defined by the lower end 31d. The mating interface 30a can define a receptacle 33 that is sized to receive a complementary mating end of the second electrical connector 28. The first electrical connector 26 can include a plurality of hold-down members 43 that are configured to attach to the first substrate 22 so as to secure the first electrical connector 26 to the first substrate 22 when the first electrical connector 26 is mounted to the first substrate 22. The connector housing 30 can include a housing body 38 and a shroud 40 that extends from the housing body 38 in the forward mating direction that is along the longitudinal direction L. The shroud 40 can thus define the front end 31a. The shroud 40 can further define the mating interface 30a.

The housing body 38 can define a first outer perimeter in a respective first plane that is oriented normal to the longitudinal direction L. Thus, the first plane can be defined by the lateral direction A and the transverse direction T. The shroud 40 can define a second outer perimeter in a respective second plane that is spaced from the first plane in the mating direction and oriented normal to the longitudinal direction L. Thus, the second plane can be defined by the lateral direction A and the transverse direction T. The second outer perimeter can be disposed outboard with respect to the first outer perimeter. At least a portion of each of the mating ends 32a can be surrounded by the second outer perimeter. Otherwise stated, the shroud 40 can surround the mating ends 32a. Further, the mating ends 32a can terminate at a location recessed from the front end 31a in the second direction. Accordingly, a plane that is normal to the longitudinal direction L can extend through the shroud 40, and the plane can be spaced from the mating ends 32a in the mating direction.

The shroud 40 can define an outer surface 42a and an inner surface 42b opposite the outer surface 42a. The inner surface 42b can at least partially define the receptacle 33. At least a portion of the outer surface 42a can define the second outer perimeter of the shroud 40. The shroud 40 can further define a first surface 44a and a second surface 44b that is spaced from the first surface 44a along the longitudinal direction L. For instance, the first surface 44a and the second surface 44b can be aligned with each other along the longitudinal direction L. The first surface 44a can face the unmating direction that is opposite the mating direction. The second surface 44b can be spaced from the first surface 44a in the mating direction. Further, the second surface 44b can be at least partially defined by a tapered portion that extends inward as it extends in the second direction from the front end 31a. Otherwise stated, a portion up to an entirety of the second surface 44b can taper outward as it extends in the mating direction. Alternatively or additionally, the second surface 44b can be planar along a plane defined by the lateral direction A and the transverse direction T. The terms "inward," "inboard" and derivatives thereof can refer to a direction from the outer surface 42a toward the inner surface 42b along a direction perpendicular to the longitudinal direction L. The terms "outward," "outboard," and derivatives thereof can refer to a direction from the inner surface 42b toward the outer surface 42a along a direction perpendicular to the longitudinal direction L.

The shroud 40 can define a shoulder 39 that extends out from the housing body 30, and a flange 41 that extends out from the shoulder 39 in the mating direction. In one example, the shoulder 39 can define the first surface 44a of the shroud 40. The shoulder 39 can extend out from the housing body 30 along a direction perpendicular to the mating direction. For instance, the shoulder can extend about the perimeter of the housing body 30. The flange 41 can thus extend out from the shoulder to a terminal end, and the second surface 44b can extend from the terminal end of the flange 41 to the shoulder 40.

It is recognized that heat can be produced during operation of the electrical connector assembly 20 at the first mating interface 30a. Accordingly, the first electrical connector 26 can define at least one heat dissipation hole 46 that extends through a respective one of the first side 31e, the second side 31f, the upper end 31c, and the lower end 31d. In one example, the at least one heat dissipation hole 46 can extend through the shroud 40, and can have a first end 46a that is open at the first surface 44a, and a second 46b end that is open at the second surface 44b. The first end 46a can be at least partially defined by the shroud 40 and at least partially defined by the housing body 30. Thus, the first end 46a can be open to the first outer perimeter of the housing body 38. The second surface 44 can define the front end 31a of the connector housing 30. Thus, the second end 46b can be offset with respect to the first end 46a in the mating direction 27. Accordingly, the at least one heat dissipation hole 46 can be oriented along a direction that is parallel to the mounting interface 30b when the first electrical connector 26 is configured as a right-angle connector. The mounting interface 30b can be configured such that when the mounting ends 32b of the electrical conductors are mounted to the first substrate 22, the heat dissipation holes 46 are oriented parallel to the first substrate 22. It should be appreciated that the first end 46a can alternatively extend through the connector housing 30 along a direction perpendicular to the longitudinal direction L.

At least a portion of the first end 46a can be disposed at a location outboard of the first perimeter and inboard of the second perimeter. For instance, an entirety of the first open end 46a can be disposed at a location outboard of the first perimeter and inboard of the second perimeter. The heat dissipation hole 46 can be oriented along the longitudinal direction L. Thus, at least a portion of the second end 46b can be aligned with the first end 46a in the mating direction. For instance, an entirety of the second end 46b can be aligned with the first end 46a in the mating direction. In one example, an entirety of the first and second ends 46a and 46b can be disposed between the first outer perimeter and the second outer perimeter. Accordingly, an entirety of the at least one heat dissipation hole 46 can be disposed between the first outer perimeter and the second outer perimeter. As will be appreciated from the description below, the at least one heat dissipation hole 46 is positioned so as to be unobstructed by the second electrical connector 28 when the first electrical connector 26 is mated to the second electrical connector 28.

As described above, the second surface 44b can be tapered. For instance, the second surface 44b can taper outward from an inner end to an outer end that is outwardly offset from the inner end. At least a portion of the second end 46b of the at least one heat dissipation hole 46 can be disposed between the inner end and the outer end, such that the at least a portion of the second end 46b is outwardly spaced from the inner end along the lateral direction A. The inner end can be defined by the inner surface 42b, and can thus define a perimeter of the receptacle 33 that is configured to receive the second electrical connector 28. The heat dissipation holes 46 can be tapered along the longitudinal direction L. Accordingly, air that is directed through the heat dissipation holes 46 can accelerate through the heat dissipation holes 46. In one example, the heat dissipation holes 46 can be tapered inwardly as they extend in the unmating direction that is opposite the mating direction. Thus, air that is directed through the heat dissipation holes 46 in the unmating direction can accelerate through the heat dissipation holes 46. Further, the first end 46a of the heat dissipation hole 46 can have a first cross-sectional area, and the second end 46b of the heat dissipation hole 46 can have a second cross-sectional area that is greater than the first cross-sectional area.

In one example, the at least one heat dissipation hole 46 includes a plurality of heat dissipation holes 46. The shroud 40 defines first and second ends that, in turn, are defined by a portion of the upper and lower ends 31c and 31, respectively, of the connector housing 30. The shroud 40 further defines first and second sides that, in turn, are defined by a portion of the first and second sides 31e and 31f, respectively, of the connector housing 30. The plurality of heat dissipation holes 46 can include at least one first heat dissipation hole 46 that extends through the first end of the shroud 40, and at least one second heat dissipation hole that extends through the second end of the shroud 40. For instance, the at least one first heat dissipation hole 46 can include a first pair of heat dissipation holes that each extend through the first end of the shroud 40, and the at least one second heat dissipation hole 46 includes a second pair of heat dissipation holes 46 that each extend through the second end of the shroud 40. The at least one heat dissipation hole 46 can include at least one third heat dissipation hole 46 that extends through the first side, and at least one fourth heat dissipation hole that extends through the second side. For instance, the at least one third heat dissipation hole 46 can include a third pair of heat dissipation holes 46 that each extend through the first side, and the at least one fourth heat dissipation hole can include a fourth pair of heat dissipation holes 46 that each extend through the second side.

As illustrated in FIGS. 2A-3, it should be appreciated that the first electrical connector 26 can be constructed in accordance with any suitable alternative embodiment as desired.

Referring now to FIG. 4, the second electrical connector 28 includes the second dielectric or electrically insulative connector housing 34 and the second plurality of electrical conductors 37 that are supported by the connector housing 30. The electrical conductors 37 define second mating ends 37a and second mounting ends 37b opposite the second mating ends 37a. In particular, the second mating ends 37a are configured to mate with respective ones of the first mating ends 32a. The second mating ends 37a can be arranged along respective columns that are spaced from each other along a row direction. The columns and the row direction can each be perpendicular to the longitudinal direction L. For instance, the row direction can be defined by the first or transverse direction T. The columns can be oriented along the third or lateral direction A. The second mating ends 37a can define alternating blades and receptacles along the respective columns. The second mating ends 37a can define alternating receptacles and blades along respective columns. Accordingly, the blades defined by the first mating ends 32a can be received by the receptacles of the second mating ends 37a, and the receptacles of the first mating ends can receive the blades of the second mating ends 37a.

The second plurality of electrical conductors 37 can be configured as electrical power conductors. Thus, the second plurality of electrical conductors 37 are configured to deliver electrical current between the second substrate 24 and the first electrical connector 26. Accordingly, the second electrical connector 28 can be referred to as an electrical power connector. Similarly, the second plurality of electrical conductors 37 can be configured as electrical power conductors. Thus, the second plurality of electrical conductors 37 are configured to deliver electrical current between the second substrate 24 and the first electrical connector 26. Accordingly, the second electrical connector 28 can be referred to as an electrical power connector. When the first and second electrical connectors 26 and 28 are mated to each other and mounted to the first and second substrate 22 and 24, respectively, electrical power is configured to travel between the first and second substrates 22 and 24 through the first and second electrical connectors 26 and 28.

Referring again to FIG. 4, the second connector housing 34 defines a mating interface 34a and a mounting interface 34b. The second mounting ends 37b can extend out from the mounting interface 34b, and are configured to be mounted to the second substrate 24. For instance, the second mounting ends 37b can be configured to be press-fit into respective through holes of the second substrate 24 so as to mount the second electrical connector 28 to the second substrate 24. For instance, the second mounting ends 37b can be configured as press-fit tails. Alternatively, the second mounting ends 37b can be configured to be surface mounted to the second substrate 24 so as to mount the second electrical connector 28 to the second substrate 24. For instance, the second mounting ends 37b can be configured as surface mount tail or fusible elements such as solder balls. The second substrate 24 can be configured as a printed circuit board. For instance, the second substrate 24 can be configured as a daughtercard, though it should be appreciated that the second substrate 24 can be alternatively configured as desired. For instance, the second substrate 24 can be configured as a backplane.

The second mating ends 37a can be disposed proximate to the mating interface 30a. The second electrical connector 28 can be configured as a vertical connector whereby the mating ends 37a are oriented parallel with the mounting ends 37b. For instance, the mating ends 37a and the mounting ends 37b can be oriented along the longitudinal direction L. In one example, the mating ends 37a can be inline with respective ones of the mounting ends 37b. Similarly, the mating interface 34a and the mounting interface 34b can be opposite each other and aligned with each other along the longitudinal direction L. Further, the mating interface 34a and the mounting interface 34b can be oriented substantially (within manufacturing tolerances) parallel to each other. For instance, the mating interface 34a and the mounting interface 34b can each be oriented along respective planes that are each defined by the lateral direction A and the transverse direction T.

Alternatively, the second electrical connector 28 can be configured as a right-angle connector. Thus, the second plurality of electrical conductors 37 can be configured as right-angle conductors, whereby the mating ends 37a and the mounting ends 37b are oriented substantially (within manufacturing tolerances) perpendicular to each other along a longitudinal direction L. For instance, the mating ends 37a can be oriented along a longitudinal direction L, and the mounting ends 37b can oriented along a direction perpendicular to the longitudinal direction. For instance, the mounting ends 37b can be oriented along the transverse direction T. Similarly, the mating interface 34a can be oriented substantially perpendicular with respect to the mounting interface 34b. For instance, the mating interface 34a can be oriented along a plane that is normal to the longitudinal direction. Thus, the plane can be defined by the transverse direction T and a second or lateral direction A that is perpendicular to each of the longitudinal direction L and the transverse direction T. The mounting interface 34b can be oriented along a plane that is defined by the longitudinal direction L and the lateral direction A.

The mating interface 34a of the connector housing can be configured as a plug that is configured to be received by the receptacle 33 of the mating interface 30a of the first electrical connector 26 so as to mate the first electrical connector 26 with the second electrical connector 28.

Figure 5:
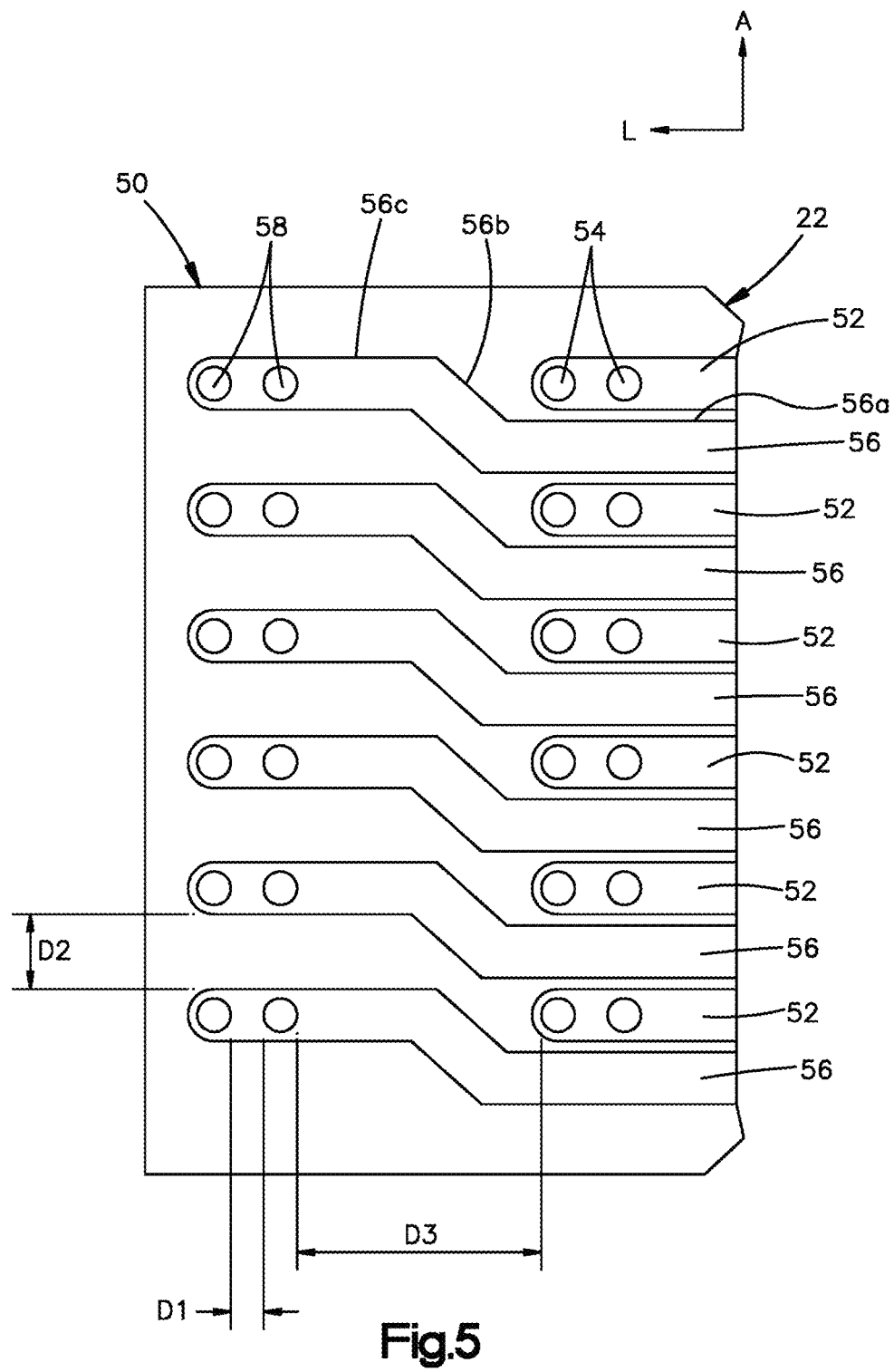
FIG. 5 is a top plan view of a portion of the first substrate.

Referring now to FIG. 5, the first substrate 22 can be provided as part of an electrical component. The electrical component can be configured as a printed circuit board 50, a bus bar, or the like. When the first substrate 22 is provided as part of a printed circuit board, the printed circuit board 50 can thus include the substrate 22. Further, when the first substrate 22 is provided as part of a printed circuit board, the substrate 22 can be made from a dielectric or electrically insulative material. It should be appreciated that the first substrate 22 can be configured as desired. The substrate 22 can carry at least one first electrical trace 52 supported by the substrate 50. For instance, the substrate 22 can carry a plurality of first electrical traces 52. The substrate 22 can further carry at least one first mounting location 54 at the first electrical trace. The at least one first mounting location 54 can be configured to physically and electrically connect with a respective first one of the first electrical conductors 32, such as the mounting end 32b, when the first electrical connector 26 is mounted to the substrate 22, thereby placing the respective one of the first mounting ends 32b in electrical communication with the first electrical trace 52. In one example, the at least one first mounting location 54 can be configured as a through hole sized and configured to receive the press-fit tail of a respective individual one of the electrical conductors 32. The through hole can be configured as an electrically plated through hole. In one example, the at least one first mounting location 54 can be configured as a first pair of mounting locations 54 configured to physically and electrically connect to a respective pair of mounting ends 32b of a first pair of the first electrical conductors 32. The respective pair of mounting ends 32b can be defined by a respective pair of the first electrical contacts 32 that define one of the blades or one of the receptacles. The first pair of mounting locations 54 can be configured as a pair of first through holes each configured to receive a respective one of the mounting ends 32b. The pair of first through holes can be aligned with each other along a common centerline. The common centerline can be oriented along the longitudinal direction L.

The first substrate 22 can further carry at least one second electrical trace 56 that is different than the first electrical trace 52 and supported by the substrate 22. For instance, the first substrate 22 can carry a plurality of second electrical traces 56. The first substrate 22 can further carry at least one second mounting location 58 at the second electrical trace 56. The at least one second mounting location 58 can be configured to physically and electrically connect with a respective second one of the first electrical conductors 32, such as one of the first mounting ends 32b, when the first electrical connector 26 is mounted to the first substrate 22, thereby placing the respective one of the first mounting ends 32b in electrical communication with the second electrical trace 56. In one example, the at least one second mounting location 58 can be configured as a through hole. The at least one first mounting location 54 can be configured as a through hole sized and configured to receive the press-fit tail of a respective individual one of the electrical conductors 32. The through hole can be configured as an electrically plated through hole. In one example, the at least one second mounting location 58 can be configured as a second pair of mounting locations configured to physically and electrically connect to a respective second pair of mounting ends 32b of a second pair of the first electrical conductors 32. The respective second pair of mounting ends 32b can be defined by a respective pair of the first electrical contacts 32 that define one of the blades or one of the receptacles. The second pair of mounting locations 58 can be configured as a pair of second through holes each configured to receive a respective one of the mounting ends 32b. The pair of second through holes can be aligned with each other along the common centerline.

For instance, the first mounting locations 54 can be configured to be placed in electrical communication with respective ones of the mounting ends 32b of a first one of the columns of the electrical contacts 32, and the second mounting locations 58 can be configured to be placed in electrical communication with respective ones of the mounting ends 32b of a second one of the columns of the electrical contacts 32. Accordingly, each of the first mounting locations 54 can be offset with respect to all of the second mounting locations 58 along the longitudinal direction L. For instance, each of the second mounting locations 58 can be offset with respect to all of the first mounting locations 54 in the mating direction. Further, a portion of the second electrical trace 56 can be aligned with a portion of the first electrical trace 52 along a direction perpendicular to the mating direction. For instance, a portion of the second electrical traces 56 can be aligned with at least a portion of the first electrical traces 52 along the lateral direction A. A portion of the second electrical traces 56 can be entirely offset from each of the first electrical traces 52 along the lateral direction A. Thus, it should be appreciated that the second electrical traces 56 are longer than the first electrical traces 52. In one example, the second electrical traces 56 are less than twice as long as the first electrical traces. The length of the first and second electrical traces 52 and 56 can be measured along the longitudinal direction L. Alternatively, the length of the first and second electrical traces 52 and 56 can be measured along the respective electrical traces.

Further, the at least one second mounting location 58 of one of the second electrical traces 56 is aligned with the at least one first mounting location 54 of one of the first electrical traces 52 along the common centerline that is oriented along the longitudinal direction L, and thus in the mating direction. A portion of the one of the second electrical traces 56 can be disposed immediately adjacent to a portion of the one of the first electrical traces 52 along the lateral direction A. The second electrical traces 56 can define a first portion 56a that are disposed adjacent and aligned with respective ones of the first electrical traces 52 along the lateral direction A, such that the first portions 56a and the first electrical traces 52 alternate along the lateral direction A. Further, the first portion 56a is parallel to the at least a portion up to an entirety of the first electrical trace 52. Each of the second electrical traces 56 can further include a transition region 56b that extends from the first portion 56a and jogs in the lateral direction A to a location aligned with one of the first electrical traces 52 that is disposed immediately adjacent the respective first portion 56a. Thus, the transition region 56b can extend along a direction oblique to the longitudinal direction L.

Each second electrical trace 56 can further include a second portion 56c that extends from the intermediate region 56b and defines the at least one mounting locations of the second electrical trace 56. Thus, the second portion 56c defines the at least one through hole, such as a pair of through holes, of the second electrical trace 56. The through holes of each first electrical trace 56 can be aligned with each other and with the through holes of the aligned first electrical trace 52 along a common centerline that is oriented along the longitudinal direction L. Thus, the intermediate region 56b is disposed between the first portion 56a and the second portion 56b. The first and second portions 56a and 56c can be oriented along the common centerline. Thus, the first and second portions 56a and 56c can be oriented along the longitudinal direction. Accordingly, both the first and second portions 56a and 56c can extend parallel to at least a portion, up to an entirety of, the first electrical traces 52.

In one example, the pair of first through holes of the first electrical traces 52 are spaced apart from each other a first distance along the common centerline, and the pair of second through holes of the second electrical traces 56 are spaced apart from each other a second distance along the common centerline that is greater than the first distance.

As should be appreciated from the illustration of holes and traces within a printed circuit board 50 in FIG. 5, when viewed in conjunction with the configuration of mounting ends, such as 32b shown in the other figures, the mounting ends are configured to enable routing of traces to all of the holes receiving mounting ends from the connector. In a power connector, such as is illustrated in FIG. 1, the traces carry a supply and a return voltage. Traces 52, for example, may be connected to a supply voltage and traces 56 may be connected to a return voltage.

As noted, holes, such as holes 54 and 58 that make connection to these traces are of relatively large diameter in comparison to a convention printed circuit board attachment. Wide holes, such as 1.6 mm finished diameter vias, or in the range of 1.4-1.8 mm, in some examples, might carry more current than multiple smaller vias. As a result, there may be fewer vias required to make connections to both a supply and a return. The two columns of vias 58 may be adequate to make connection to one such voltage level and the two columns of vias 54 may be adequate to make connection to the other such level.

The vias are spaced close together in the lateral direction L, which is the direction in which the traces run. In the example of FIG. 5, that spacing is shown as D1 and may be 5 mm on center, or in some embodiments in the range of 3 to 8 mm. Because of the larger current carrying capacity of the larger vias, fewer vias are needed and they may be separated by a distance D2 in the lateral direction. D2 may be on the order of 10 mm, such as between 8 and 12 mm.

As can be seen in FIG. 5, this spacing allows traces 56 to pass through the column of vias 54. Such a configuration enables both a supply and a return potential to be routed to the power connector on a single layer of a printed circuit board. Using a single layer for routing supply and return—or any two voltage levels may be desirable in many circuit assemblies, where using fewer layers can lead to lower cost and other advantages.

Further, by having relatively closely spaced holes in the lateral direction, a relatively large distance D3 may separate the columns of vias 54 and 56. D3, for example, may be greater than 18 mm, or, in some embodiments greater than 20 mm or in the range of 18-20 mm in other embodiments.

This spacing enables a connector, with the configuration of contact tails illustrated in FIG. 1, for example, to plug into a circuit board as shown in FIG. 5 or into bus bars or other substrates. The inventors have recognized that, when bus bars, vias to access a supply and a return potential may be separated by a larger distance than vias on a printed circuit board. Such separation results from less precise manufacturing techniques used to manufacture the bus bar than to manufacture a printed circuit board and differences in construction, requiring physical separation between bus bars to route power or return lines to the bus bars. In some embodiments, the distance D3 may be selected to match a separation achievable between vias in supply and return bus bars. Accordingly, a connector as shown and described above may be used with a printed circuit board or a bus bar, providing the advantage of reusing components.

Moreover, use of large holes in connection with a bus bar reduces the cost of manufacture of the bus bar. The inventors have recognized and appreciated that making small holes in a bus bar requires drilling, but larger holes, on the order of 1.6 mm, may be made with techniques, such as punching, which are faster and therefore less expensive. Thus, the specific size and position of contact tails of a connector as described above, leads to lowe cost electronic systems for multiple reasons.

It should be appreciated that the electrical connector assembly 20 is configured to dissipate heat during operation. Thus, a method can be provided for dissipating heat in the first electrical power connector 26. The method can include the step of mating the first electrical power connector 26 with the second electrical power connector 28 in the mating direction, so as to place the first electrical conductors 32 in physical and electrical conductor with the complementary electrical conductors 37 of the second electrical connector 28. The method can further include the step of directing air through at least one heat dissipation hole 46 that extends through the shroud 40 at a location outboard of the housing body 38, such that at least a portion of the directed air flows along an outer surface of the housing body 38. Thus, the directed air can remove heat from the first electrical connector 26. The directing step can cause the directed air to flow in a direction opposite the mating direction. In one example, the directing step can occur under pressure generated by an air mover, such as a fan. In one example, the heat dissipation holes 46 can be tapered inwardly along a direction opposite the mating direction. Accordingly, the directing step can include the step of accelerating a flow rate of the air through the at least one heat dissipation hole 46, such as each of the plurality of heat dissipation holes 3546.

The method can further include the step of mounting the first electrical connector 26 to the first substrate 22. The directing step can therefore cause the directed air to flow along the first substrate 22 so as to remove heat from the substrate. The mounting step can include the steps of mounting respective ones of a first pair of mounting ends 32b of a first pair of the first electrical conductors 32 to respective ones of a first pair of the mounting locations 54 of the first electrical trace 52, and mounting respective ones of a second pair of mounting ends 32b of a second pair of the electrical conductors 32 to respective ones of the second pair of mounting locations 58 of the second electrical trace 56. Because the first and second pairs of mounting locations 54 and 58 can be aligned with each other along the common centerline, each of the first and second pairs of mounting ends 32 can also be inline with each other along a common centerline after the mounting steps. The first pair of the electrical conductors can define a blade or a receptacle, and the second pair of the electrical conductors can similarly define a blade or a receptacle. As described above, the first and second pairs of mounting locations 54 and 58 can define respective through holes, and the first and second pairs of mounting ends 32b can be configured as press-fit tails. Accordingly, the mounting step can include the step of press fitting the press-fit tails into the respective ones of the first and second pairs of mounting locations 54 and 58.

The foregoing description is provided for the purpose of explanation and is not to be construed as limiting the invention. While various embodiments have been described with reference to preferred embodiments or preferred methods, it is understood that the words which have been used herein are words of description and illustration, rather than words of limitation. Furthermore, although the embodiments have been described herein with reference to particular structure, methods, and embodiments, the invention is not intended to be limited to the particulars disclosed herein. Further, structure and methodologies described in connection with one electrical connector herein can apply equally to the other electrical connector in certain examples. Those skilled in the relevant art, having the benefit of the teachings of this specification, may effect numerous modifications to the invention as described herein, and changes may be made without departing from the spirit and scope of the invention as defined by the appended claims.

What is claimed is:

1. An electrical connector comprising:
   a plurality of electrical conductors, the electrical conductors comprising respective mounting ends that extend through a mounting interface, and mating ends configured to mate with respective ones of a plurality of complementary electrical conductors of a second electrical connector in a mating direction; and a housing supporting the plurality of electrical conductors and comprising:

a housing body comprising a receptacle configured to receive the complementary electrical connector, wherein the housing body comprises a first outer perimeter bounding the receptacle, and wherein the mating ends are disposed within the receptacle, and a shroud extending from the housing body at the first outer perimeter, the shroud comprising:

a second outer perimeter, the second outer perimeter being outboard with respect to the first outer perimeter, first and second opposite surfaces extending from the first outer perimeter to the second outer perimeter, and at least one heat dissipation hole extending through the shroud between the first surface and the second surface so as to be outside the first outer perimeter bounding the receptacle.

2. The electrical connector of claim 1, wherein the second surface tapers in the mating direction.

3. The electrical connector of claim 1, wherein:

the shroud comprises upper and lower ends that are opposite each other along a row direction that is perpendicular to the mating direction, and the at least one heat dissipation hole comprises at least one first heat dissipation hole that extends through the upper end, and at least one second heat dissipation hole that extends through the lower end.

4. The electrical connector of claim 1, wherein the mating ends of the electrical conductors are arranged along respective columns that are spaced from each other along a row direction, and each column of the mating ends comprises alternating blades and receptacles.

5. The electrical connector of claim 1, wherein:

the shroud comprises upper and lower ends that are opposite each other along a row direction that is perpendicular to the mating direction, and first and second sides that are opposite each other along a column direction that is perpendicular to each of the row direction and the mating direction, and the at least one heat dissipation hole comprises at least one first heat dissipation hole that extends through the upper end, and at least one third heat dissipation hole that extends through the first side.

6. The electrical connector of claim 1, wherein the shroud comprises a shoulder that extends out from the housing body, and a flange that extends out from the shoulder in the mating direction.

7. The electrical connector of claim 6, wherein the shoulder comprises the first surface.

8. The electrical connector of claim 6, wherein the shoulder extends out from the housing body along a direction perpendicular to the mating direction.

9. The electrical connector of claim 6, wherein the flange extends out from the shoulder to a terminal end, and the second surface extends from the terminal end of the flange to the shoulder.

10. The electrical connector of claim 1, wherein the at least one heat dissipation hole is oriented parallel to the mounting interface.

11. The electrical connector of claim 1, wherein the housing body comprises an opening into the receptacle configured to receive the plurality of complementary electrical conductors of the second electrical connector therethrough; and the shroud is configured to bound the opening of the housing body.

12. The electrical connector of claim 1, wherein the at least one heat dissipation hole has a first cross-sectional area on the first surface of the shroud, a second cross-sectional area on the second surface of the shroud, and the second cross-sectional area is greater than the first cross-sectional area.

13. A method for dissipating heat in an electrical power connector of the type including a housing having a housing body and a shroud extending from the housing body, and a plurality of electrical conductors supported by the housing, the method comprising:

mating the electrical power connector with a second electrical power connector in a mating direction, so as to place the electrical conductors in physical and electrical connection with complementary electrical conductors of the second electrical connector; and directing air through at least one heat dissipation hole that extends through the shroud at a location outboard of the housing body, wherein the directing air through the at least one heat dissipation hole causes at least a portion of the directed air to flow along a path that includes the at least one heat dissipation hole, an outer surface of the housing body adjacent a first side of the at least one heat dissipation hole, and an outer surface of a housing of the second electrical connector adjacent a second side of the at least one heat dissipation hole.

14. The method of claim 13, wherein directing air through the at least one heat dissipation hole causes at least a portion of the directed air to flow in a direction opposite the mating direction.

15. The method of claim 13, wherein directing air through the at least one heat dissipation hole occurs under pressure.

16. The method of claim 13, wherein the at least one heat dissipation hole is tapered along the mating direction.

17. The method of claim 13, wherein:

the electrical connector is mounted to a substrate; and directing air through the at least one heat dissipation hole comprises directing air to flow along the substrate.

18. The method of claim 17, wherein the flowing air dissipates heat from the electrical connector and the substrate.

19. An electrical connector assembly comprising: a first electrical connector, comprising: a plurality of electrical conductors comprising respective mounting ends and mating ends opposite the mounting ends, and a housing supporting the plurality of electrical conductors and comprising a housing body comprising a receptacle configured to receive the complementary electrical connector, wherein the housing body comprises a first outer perimeter bounding the receptacle, and wherein the mating ends are disposed within the receptacle, and a shroud extending from the housing body at the first outer perimeter, the shroud comprising the first outer perimeter, a second outer perimeter being outboard with respect to the first outer perimeter, first and second opposite surfaces extending between the first and second outer perimeters, and at least one heat dissipation hole extending through the first and second surfaces so as to be outside the first outer perimeter bounding the receptacle; and a second electrical connector comprising; mating ends configured to mate with respective ones of the mating ends of the plurality of electrical conductors of the first electrical connector, and an outer perimeter enclosing the second electrical connector, wherein at least a portion of the at least one heat dissipation hole is outside the outer perimeter of the second electrical connector when the first and second electrical connectors are mated.

20. The electrical connector assembly of claim 19, wherein the first surface of the shroud faces the second electrical connector and at least partially tapers outward as it extends toward the second electrical connector.

* * * * *